US011774235B2

(12) United States Patent
David et al.

(10) Patent No.: US 11,774,235 B2
(45) Date of Patent: *Oct. 3, 2023

(54) GROUPING SPECTRAL DATA FROM POLISHING SUBSTRATES

(71) Applicant: Applied Materials, Inc., Santa Clara, CA (US)

(72) Inventors: Jeffrey Drue David, San Jose, CA (US); Boguslaw A. Swedek, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 140 days.

This patent is subject to a terminal disclaimer.

(21) Appl. No.: 16/024,312

(22) Filed: Jun. 29, 2018

(65) Prior Publication Data

US 2018/0321026 A1      Nov. 8, 2018

Related U.S. Application Data

(63) Continuation of application No. 14/063,740, filed on Oct. 25, 2013, now Pat. No. 10,012,494.

(51) Int. Cl.
*G01B 11/06* (2006.01)
*B24B 37/013* (2012.01)
(Continued)

(52) U.S. Cl.
CPC .......... *G01B 11/06* (2013.01); *B24B 37/013* (2013.01); *B24B 49/12* (2013.01);
(Continued)

(58) Field of Classification Search
CPC ......... G01B 11/06; H01L 22/12; B24B 49/12; B24B 37/013
(Continued)

(56) References Cited

U.S. PATENT DOCUMENTS

| 5,747,380 A | 5/1998 | Yu et al. |
| 6,153,116 A | 11/2000 | Yang et al. |

(Continued)

FOREIGN PATENT DOCUMENTS

| CN | 101770584 | 7/2010 |
| CN | 101960580 | 1/2011 |

(Continued)

OTHER PUBLICATIONS

Japanese Office Action in Japanese Application No. 2014-214966, dated Aug. 28, 2018, 4 pages (English Translation).

(Continued)

*Primary Examiner* — Eman A Alkafawi
(74) *Attorney, Agent, or Firm* — Fish & Richardson P.C.

(57) ABSTRACT

Among other things, a computer-based method is described. The method comprises receiving, by one or more computers, a plurality of measured spectra reflected from a substrate at a plurality of different positions on the substrate. The substrate comprises at least two regions having different structural features. The method also comprises performing, by the one or more computers, a clustering algorithm on the plurality of measured spectra to separate the plurality of measured spectra into a number of groups based on the spectral characteristics of the plurality of measured spectra; selecting one of the number of groups to provide a selected group having a subset of spectra from the plurality of measured spectra; and determining, in the one or more computers, at least one characterizing value for the substrate based on the subset of spectra of the selected group.

15 Claims, 6 Drawing Sheets

(51) Int. Cl.
*B24B 49/12* (2006.01)
*H01L 21/66* (2006.01)
(52) U.S. Cl.
CPC .......... *G01B 11/0625* (2013.01); *H01L 22/12* (2013.01); *H01L 22/20* (2013.01); *H01L 22/26* (2013.01)
(58) Field of Classification Search
USPC .................................................. 702/170, 172
See application file for complete search history.

(56) References Cited

U.S. PATENT DOCUMENTS

| | | | |
|---|---|---|---|
| 6,271,047 | B1 | 8/2001 | Ushio et al. |
| 6,358,327 | B1 | 3/2002 | Pokhama et al. |
| 6,361,646 | B1 | 3/2002 | Bibby et al. |
| 6,491,569 | B2 | 12/2002 | Bibby, Jr. et al. |
| 6,676,482 | B2 | 1/2004 | Bibby et al. |
| 6,806,948 | B2 | 10/2004 | Katz et al. |
| 7,764,377 | B2 | 7/2010 | Benvegnu et al. |
| 8,009,938 | B2 | 8/2011 | Davis et al. |
| 8,478,057 | B1 | 7/2013 | Cui |
| 8,992,286 | B2 | 3/2015 | Cherian et al. |
| 10,012,494 | B2 | 7/2018 | David et al. |
| 2007/0042675 | A1 | 2/2007 | Benvegnu |
| 2007/0224915 | A1* | 9/2007 | David .................. B24B 37/013 451/5 |
| 2008/0243433 | A1 | 10/2008 | Ravid et al. |
| 2010/0093260 | A1 | 4/2010 | Kobauashi et al. |
| 2010/0103411 | A1 | 4/2010 | Holden |
| 2010/0129939 | A1* | 5/2010 | David .................. B24B 37/013 438/8 |
| 2011/0281510 | A1 | 11/2011 | Benvegnu et al. |
| 2012/0017045 | A1 | 1/2012 | Haines |
| 2012/0026492 | A1 | 2/2012 | Zhang et al. |
| 2012/0170830 | A1 | 7/2012 | Blanton |
| 2013/0035888 | A1 | 2/2013 | Kandel |
| 2013/0149938 | A1 | 6/2013 | Kobayashi et al. |
| 2013/0170541 | A1 | 7/2013 | Pace |

FOREIGN PATENT DOCUMENTS

| | | |
|---|---|---|
| CN | 102884613 | 1/2013 |
| CN | 102893377 | 1/2013 |
| CN | 103155110 | 6/2013 |
| JP | 2009-505847 | 2/2009 |
| JP | 2011-009679 | 1/2011 |
| KR | 2008-0090326 | 10/2008 |
| KR | 10-2014-0140598 | 12/2014 |
| WO | WO2007024807 | 3/2007 |

OTHER PUBLICATIONS

Korean Office Action in KR Application No. 10-2013-7008965, dated Jul. 24, 2013, 4 pages.
KR Office Action in Korean Application No. 10-2014-0145362, dated Sep. 28, 2020, 5 pages (with English translation).
KR Notice of Allowance in Korean Appln. 10-2014-0145362, dated Apr. 26, 2021, 3 pages (with English Translation).

* cited by examiner

GROUPING SPECTRAL DATA FROM POLISHING SUBSTRATES

CROSS-REFERENCE TO RELATED APPLICATIONS

This application is a continuation of U.S. patent application Ser. No. 14/063,740, filed Oct. 25, 2013, the disclosure of which is incorporated by reference.

TECHNICAL FIELD

The present disclosure relates to grouping spectral data from polishing substrates, e.g., for controlling or understanding chemical mechanical polishing of the substrates.

BACKGROUND

An integrated circuit is typically formed on a substrate by the sequential deposition of conductive, semiconductive, or insulative layers on a silicon wafer. A variety of fabrication processes require planarization of a layer on the substrate. For example, for certain applications, e.g., polishing of a metal layer to form vias, plugs, and lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as slurry with abrasive particles, is typically supplied to the surface of the polishing pad.

One problem in CMP is determining whether the polishing process is complete, i.e., whether a substrate layer has been planarized to a desired flatness or thickness, or when a desired amount of material has been removed. Variations in the initial thickness of the substrate layer, the slurry composition, the polishing pad condition, the relative speed between the polishing pad and the substrate, and the load on the substrate can cause variations in the material removal rate. These variations cause variations in the time needed to reach the polishing endpoint. Therefore, it may not be possible to determine the polishing endpoint merely as a function of polishing time.

In some systems, a substrate is optically measured in a stand-alone metrology station. However, such systems often have limited throughput. In some systems, a substrate is optically monitored in-situ during polishing, e.g., through a window in the polishing pad. However, existing optical monitoring techniques may not satisfy increasing demands of semiconductor device manufacturers.

SUMMARY

In one aspect, a computer-based method comprises receiving, by one or more computers, a plurality of measured spectra reflected from a substrate at a plurality of different positions on the substrate. The substrate comprises at least two regions having different structural features. The method also comprises performing, by the one or more computers, a clustering algorithm on the plurality of measured spectra to separate the plurality of measured spectra into a number of groups based on the spectral characteristics of the plurality of measured spectra; selecting one of the number of groups to provide a selected group having a subset of spectra from the plurality of measured spectra; and determining, in the one or more computers, at least one characterizing value for the substrate based on the subset of spectra of the selected group.

In another aspect, a computer program product resides on a computer readable medium and comprises instructions for causing a processor to: receive a plurality of measured spectra reflected from a substrate at a plurality of different positions on the substrate. The substrate comprises at least two regions having different structural features. The processor is also caused to perform a clustering algorithm on the plurality of measured spectra to separate the plurality of measured spectra into a number of groups based on the spectral characteristics of the plurality of measured spectra; select one of the number of groups to provide a selected group having a subset of spectra from the plurality of measured spectra; and determine, at least one characterizing value for the substrate based on the subset of spectra of the selected group.

In another aspect, a computer system comprises a processor; a memory; and a storage device that stores a program for execution by the processor using the memory. The program comprises instructions configured to cause the processor to: receive a plurality of measured spectra reflected from a substrate at a plurality of different positions on the substrate. The substrate comprises at least two regions having different structural features. The processor is also caused to perform a clustering algorithm on the plurality of measured spectra to separate the plurality of measured spectra into a number of groups based on the spectral characteristics of the plurality of measured spectra; select one of the number of groups to provide a selected group having a subset of spectra from the plurality of measured spectra; and determine, in the computer, at least one characterizing value for the substrate based on the subset of spectra of the selected group.

Certain implementations of the method, the computer program product, and/or the computer system may include one or more of the following advantages. The characterizing value is a thickness of an outermost layer of the substrate. The clustering algorithm comprises a k-means clustering algorithm. Performing the clustering algorithm comprises initializing a centroid for each group. Initializing a centroid for each group comprises selecting a spectrum from the plurality of measured spectra to provide a selected spectrum and setting the centroid to have the spectral characteristics of the selected spectrum. Initializing a centroid for each group comprises selecting a pair of spectra from the plurality of measured spectra having a greatest distance metric, setting a first centroid to have the spectral characteristics of a first spectrum of the pair of spectra and setting a second centroid to have the spectra characteristics of a second spectrum of the pair of spectra. Selecting a pair of spectra from the plurality of measured spectra having a greatest distance metric comprises determining a Euclidian distance between every pair of spectra from the plurality of measured spectra and selecting a pair of spectra that has the largest Euclidean distance. Performing the clustering algorithm comprises assigning each spectra of the received plurality of spectra to its nearest, initialized centroid and forming multiple groups based on the assignment. Performing the clustering algorithm comprises generating a new centroid for each group by averaging the spectra in each group. Performing the clustering algorithm comprises reassigning each spectra of the received plurality of spectra to its nearest new centroid and forming multiple new groups based on the assignment. Performing the clustering algorithm comprises iteratively updating the new centroids and forming new groups until the new centroids converge. The number of groups is chosen based on a number of regions expected on the substrate. The number of groups is chosen to be larger than or equal to the number of regions expected on the substrate. The plurality of measured spectra are measured with an in-line monitoring system before or after polishing of the substrate. The plurality of measured spectra are measured with an in-situ monitoring system during polishing of the substrate. A polishing endpoint is determined based on the characterizing value.

Certain implementations may include one or more of the following advantages. Clustered spectra data can represent different structural features on a single wafer. Characteristic values determined based on the clustered spectra can be used to characterize the progress of polishing at the different structural features. The thickness of the layer being polished can be measured at different locations that have different structural features. Endpoints of polishing can be determined at with higher precision based on selected structural features on a wafer. Reliability of the endpoint system to detect a desired polishing endpoint may be improved.

DETAILED DESCRIPTION

One optical monitoring technique for controlling a polishing operation is to measure a spectrum of light reflected from a substrate, either in-situ during polishing or at an in-line metrology station, and fit a function, e.g., an optical model, to the measured spectra. Another technique is to compare the measured spectrum to a plurality of reference spectra from a library, and identify a best-matching reference spectrum.

Either fitting of the optical model or identification of the best matching reference spectrum is used to generate a characterizing value, e.g., the thickness of the outermost layer. For the fitting, the thickness can be treated as an input parameter of the optical model, and the fitting process generates a value for the thickness. For finding a match, the thickness value associated with the reference spectrum can be identified.

Chemical mechanical polishing can be used to planarize the substrate until a predetermined thickness of the first layer is removed, a predetermined thickness of the first layer remains, or until the second layer is exposed.

Generally, substrate has regions with different structural features, e.g., different layer stacks and different feature densities. In addition, the different regions may have different thicknesses. In performing the optical monitoring, multiple spectra of light reflected from different regions of the substrate or the outermost layer are measured. The methods and systems of this disclosure cluster these spectra into multiple clusters or groups that correspond to those different regions that have different structural features. Each group or cluster of spectra contains information that characterizes the corresponding structural feature. Charactering values determined based on different spectra groups or clusters can be used, e.g., for controlling the polishing process or understanding the polishing process through tracing.

Figure 1:
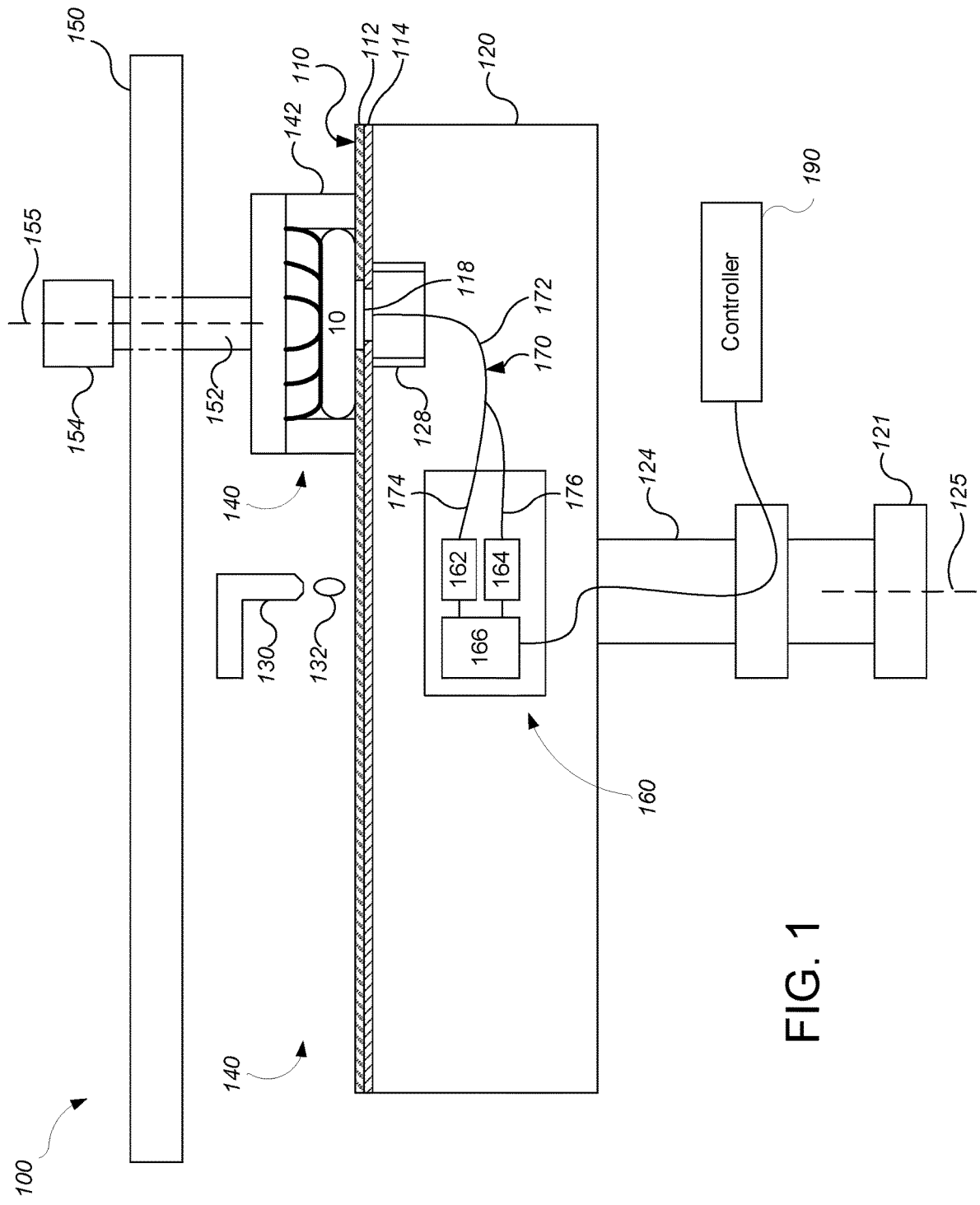
FIG. 1 illustrates a schematic cross-sectional view of an example of a polishing station.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

The polishing apparatus 100 includes one or more carrier heads 140. Each carrier head 140 is operable to hold a substrate 10, such as a wafer, against the polishing pad 110. Each carrier head 140 can have independent control of the polishing parameters, for example pressure, associated with each respective substrate. Each carrier head includes a retaining ring 142 to hold the substrate 10 in position on the polishing pad 110.

Each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage 108 that supports the carrier head 140 along the track.

In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ optical monitoring system 160, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118.

Figure 2:
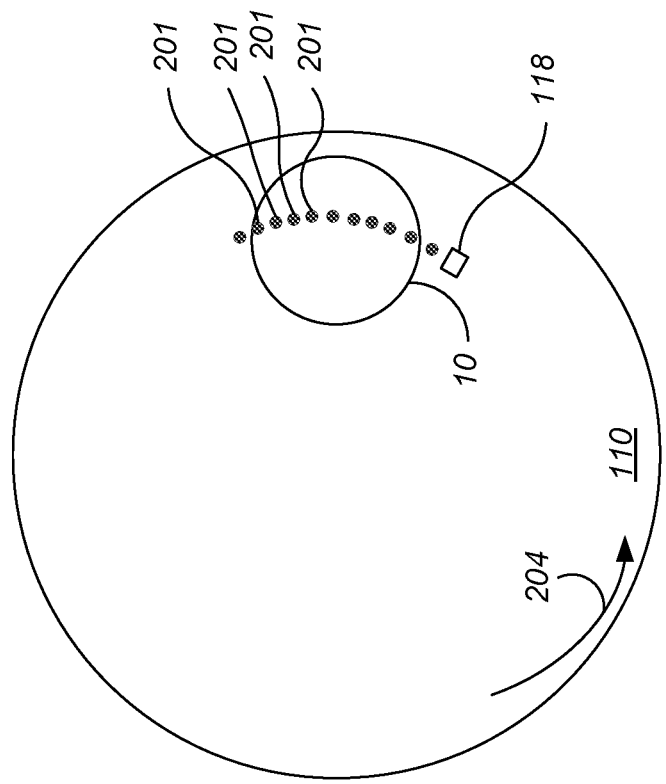
FIG. 2 illustrates a schematic top view of a substrate having multiple zones.

Referring to FIG. 2, if the window 118 is installed in the platen, due to the rotation of the platen (shown by arrow 204), as the window 108 travels below a carrier head, the optical monitoring system making spectra measurements at a sampling frequency will cause the spectra measurements to be taken at locations 201 in an arc that traverses the substrate 10.

Figure 3:
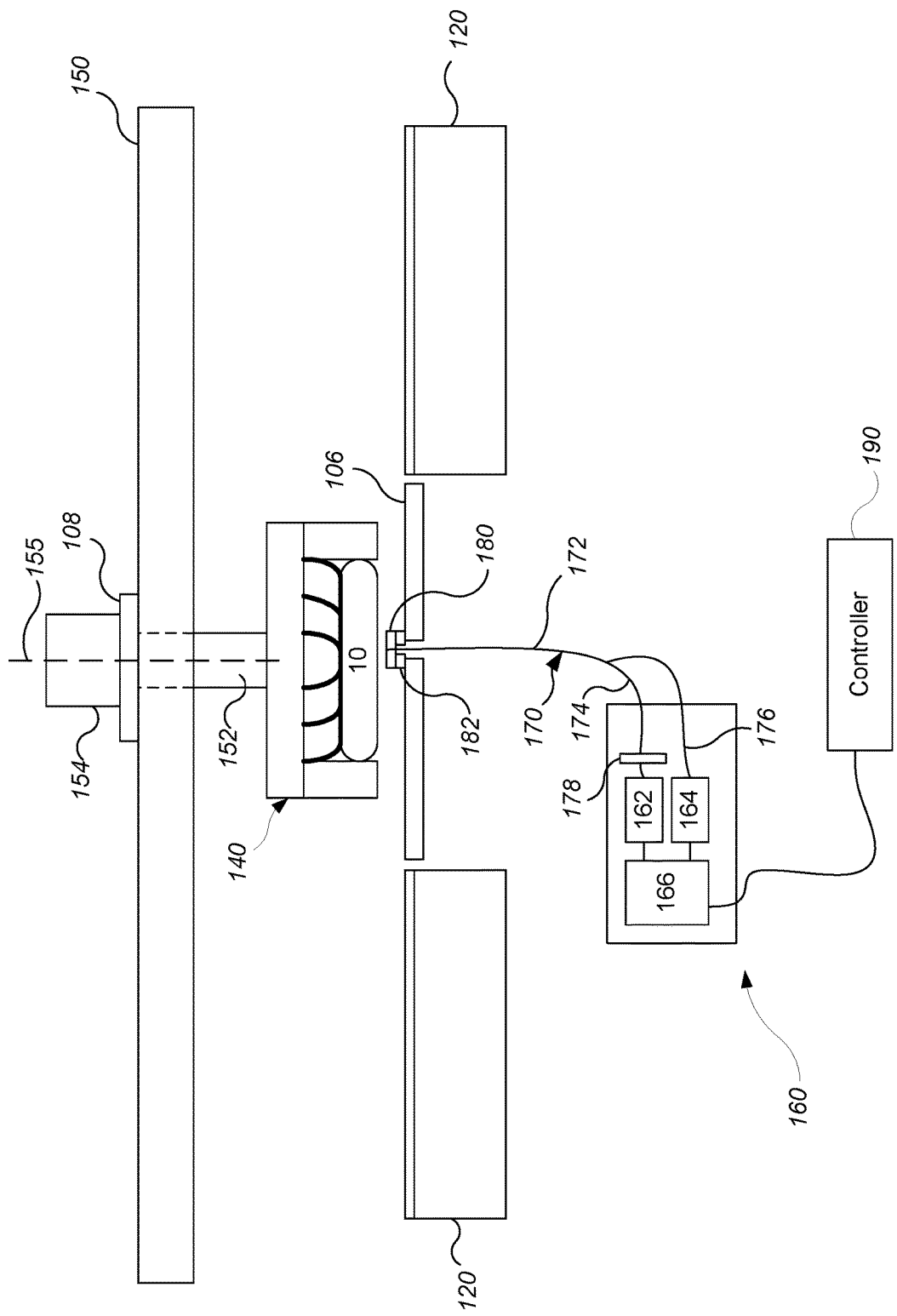
FIG. 3 illustrates a schematic cross-sectional view of an example of an in-line monitoring station.

In some implementation, illustrated in FIG. 3, the polishing apparatus includes an in-sequence optical monitoring system 160 having a probe 180 positioned between two polishing stations or between a polishing station and a transfer station. The probe 180 of the in-sequence monitoring system 160 can be supported on a platform 106, and can be positioned on the path of the carrier head.

The probe 180 can include a mechanism to adjust its vertical height relative to the top surface of the platform 106. In some implementations, the probe 180 is supported on an actuator system 182 that is configured to move the probe 180 laterally in a plane parallel to the plane of the track 128. The actuator system 182 can be an XY actuator system that includes two independent linear actuators to move probe 180 independently along two orthogonal axes. In some implementations, there is no actuator system 182, and the probe 180 remains stationary (relative to the platform 106) while the carrier head 126 moves to cause the spot measured by the probe 180 to traverse a path on the substrate.

Figure 4:
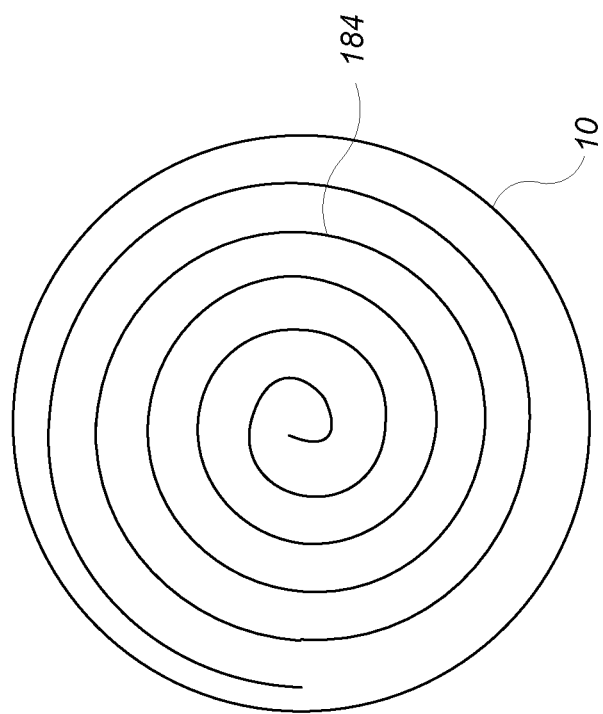
FIG. 4 illustrates a top view of a polishing pad and shows locations where in-situ measurements are taken on a substrate.

Referring to FIG. 4, the probe 180 can traverse a path 184 over the substrate while the monitoring system take a sequence of spectra measurements, so that a plurality of spectra are measured at different positions on the substrate. By proper selection of the path and the rate of spectra measurement, the measurements can be made at a substantially uniform density over the wafer. Alternatively, more measurements can be made near the edge of the substrate.

In the specific implementation shown in FIG. 4, the carrier head 126 can rotate while the carriage 108 causes the center of the substrate to move outwardly from the probe 180, which causes the spot 184 measured by the probe 180 to traverse a spiral path 184 on the substrate 10. However, other combinations of motion can cause the probe to traverse other paths, e.g., a series of concentric circles or a series of arcuate segments passing through the center of the substrate 10. Moreover, if the monitoring station includes an XY actuator system, the measurement spot 184 can traverse a path with a plurality of evenly spaced parallel line segments. This permits the optical metrology system 160 to take measurements that are spaced in a rectangular pattern over the substrate.

Returning to FIGS. 1 and 3, in either the in-situ or in-sequence embodiments, the optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber an include a trunk 172 positioned in proximity to the optical access, and two branches 174 and 176 connected to the light source 162 and detector 164, respectively. The probe 180 can include the trunk end of the bifurcated optical fiber.

The light source 162 can be operable to emit white light. In one implementation, the white light emitted includes light having wavelengths of 200-800 nanometers. In some implementations, the light source 162 generates unpolarized light. In some implementations, a polarization filter 178 (illustrated in FIG. 3, although it can be used in the in-situ system of FIG. 1) can be positioned between the light source 162 and the substrate 10. A suitable light source is a xenon lamp or a xenon mercury lamp.

The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency).

As noted above, the light source 162 and light detector 164 can be connected to a computing device, e.g., the controller 190, operable to control their operation and receive their signals. The computing device can include a microprocessor situated near the polishing apparatus, e.g., a programmable computer. In operation, the controller 190 can receive, for example, a signal that carries information describing a spectrum of the light received by the light detector for a particular flash of the light source or time frame of the detector.

The substrate 10 to be polished by the polishing apparatus can typically have a diameter of about 8-18 and include tens, hundreds or even thousands of dies that can be separated from each other after the substrate 10 is polished, e.g., by cutting. Each die can span about 1 inch or less. In some implementations, the dies on the substrate 10 are separated from each other by scribe lines to facilitate the separation.

Each die can be a device, such as a memory chip, central processing unit, or the like. In general, a die can have multiple regions having different physical characteristics that result in different spectral reflection of the light. The different regions can be regions with different densities of features, different arrangements of features, or different layer structures. For example, there can be regions with metal features in a regular pattern, e.g., an area on the substrate with memory cells. As another example, there can be regions with high density of metal features that are not in a regular array, e.g., portion with processors or logic. There can be regions that are substantially a continuous metal feature, e.g., a contact pad. There can be regions with no or a low density of metal features, e.g., dielectric field. There can be regions that are not part of the die at all and have a different (usually simple) layer stack, e.g., the scribe line.

Figure 5A:
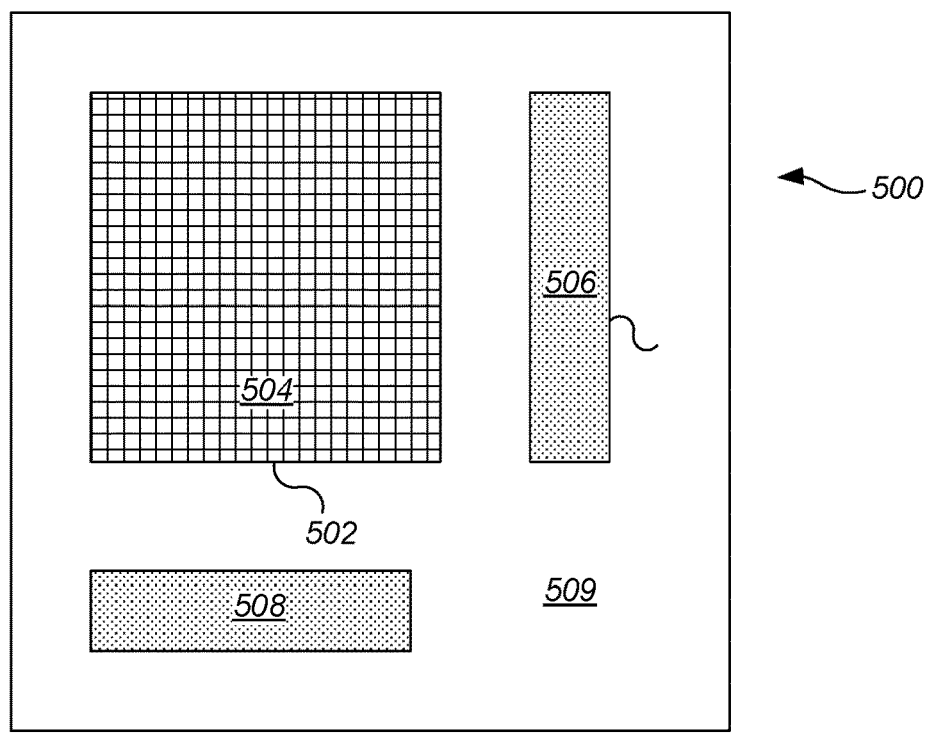
FIG. 5A illustrates a schematic top view of an example die.

For example, FIG. 5A shows a memory chip 500 including a center region 502 containing memory cells 504. The region 502 can contain millions of memory cells 504 that are identical and are arranged in a grid form. Each memory 504 cell can have a size in the order of microns or less. The memory chip 500 also includes a region 506 that contains address lines and a region 508 that contains control units. The chip may include other regions and structures. Each regions 504, 506, 508 has different physical characteristics. For example, the region 504 contains memory cells in a generally regular array, while the region 504 and 506 may include metal lines and other physical structures that are not arranged in a pattern as regular as the pattern in the region 504.

Figure 5B:
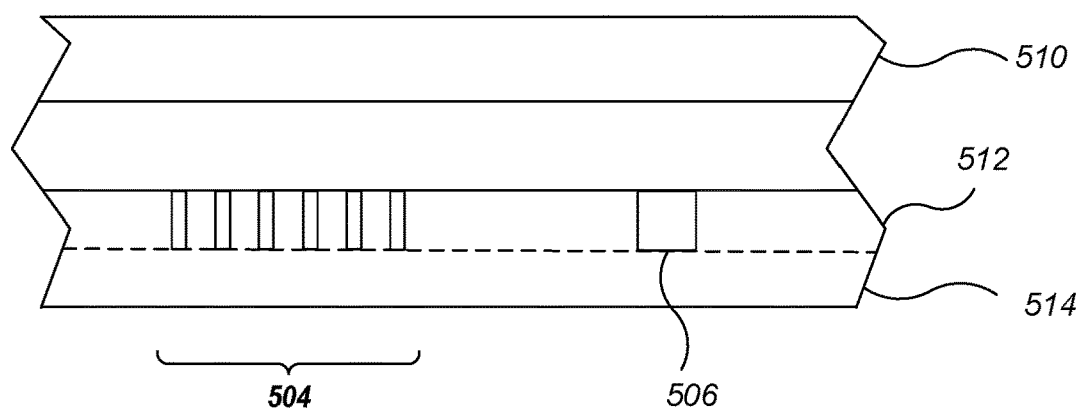
FIG. 5B illustrates a schematic cross-sectional view of an example die.

In a schematic cross-sectional view shown in FIG. 5B, the substrate has multiple layers, including an underlying semiconductor wafer 510, a patterned layer 512 that includes the features, and an outer layer 514 that will be subjected to polishing. There can also be additional layers between the wafer 510 and the patterned layer 512 and/or between the patterned layer 514 and the outer layer 514. The different portions of the substrate corresponding to the different regions, such as the regions 504, 506 may have different combinations of layers, different materials in different layers, and/or different feature densities.

Generally, in thickness monitoring, the light flashed from the light source 162 on the substrate 10 has a diameter of about 2 mm, 0.5 mm, or smaller. The light spot may be on any one of the regions of a die. In the example shown in FIGS. 5A and 5B, the light spot may be in the region 502 and cover hundreds of memory cells, in the region 504, in the region 506, or in a region 509 that does not contain any functional structures. It is also possible that the light spot covers parts of two or more regions.

In some implementations, the reflected light measured from the substrate 10 to determine the thickness of the substrate 10, in an in-line system or in an in-situ system, can correspond to light spots landed, e.g., randomly landed, at any region of a die. As explained with respect to FIGS. 2 and 4, as the polishing surface 110 and the substrate 10 move, e.g., rotate, relative to each other, multiple spectra measurements are performed, e.g., at each rotation of the platen or every multiple rotations of the platen. For example, when the die is a memory chip, some flashes of light can land on a peripheral region, and some flashes of light can be directed to land on the center region. In another example, flashes may be land on SRAM (static random-access memory) areas of the memory chip (not shown in FIGS. 5A and 5B). In some implementations, the size of the light spot on the wafer surface can be chosen based on the size of the structural regions to be measured. Generally, the light spot size is chosen to be smaller than the surface area of the region for which the thickness is measured. For example, to measure the thickness of the peripheral region of the memory, the spot size is chosen such that when landed in the peripheral area, the light spot does not reach the center region.

As a result, the light reflected from different locations of a die may have different characteristics, i.e., different light spectra, corresponding to the different regions having different physical characteristics, e.g., as identified above.

In some implementations, spectra measured from regions having similar physical characteristics are grouped together. Within each group, the spectra have common features corresponding to the common physical characteristics of the measured region. The common features may include noise data.

When a reference spectrum is used in determining the substrate thickness, e.g., an endpoint thickness, in some implementations, the reference spectrum may be generated by spectra from a selected region of a die. Accordingly, a group of spectra that corresponds to the selected region can be used with the reference spectrum for determining the substrate thickness. Sometimes multiple reference spectra can be generated for multiple regions of the die, and multiple groups of spectra that correspond to the multiple regions can be used with the reference spectra for determining the substrate thicknesses.

The grouped spectra can be used to determine thicknesses of the substrate or regions of the substrate efficiently and precisely. When a reference spectrum is associated with one particular region of a die, using the reference spectrum with spectra that are measured from other regions of the die may produce imprecise results. When the spectra are grouped, precise results can be generated using a spectra group that corresponds to the particular region of the die. Sometimes the polishing endpoint may be determined based on the thickness of one particular structural region of a die. Other times it may be desirable to control or measure the thickness of a particular structural region instead of the entire substrate. The grouped spectra representing different types of structural regions of the dies on a substrate can allow a user to apply a model to a particular group of spectra to determine a thickness for its corresponding type of regions. The thicknesses determined for one particular type of device or structural feature of the wafer can also allow the user to track the polishing of the type of regions, or to apply an empirically collected library, e.g., an RLF empirical library, to that spectral group.

In the example of the memory chip 500, measured spectra can be grouped into two or more groups. For example, one group can correspond to the region 504, and the other group can correspond to the other regions of the chip 500. More groups can be formed to separate the spectra for the different regions 506, 508, or to contain spectra that correspond to a blend of multiple regions, which are generated when a light spot lands on multiple regions.

Furthermore, generally, the measured spectra contain noise data. In some implementations, the grouped spectra may have the noise reduced or eliminated before being used for determining the thicknesses of the structural features. Examples of noise reduction techniques are discussed in U.S. Ser. No. 14/063,917, entitled REDUCING NOISE IN SPECTRAL DATA FROM POLISHING SUBSTRATES, filed on the same day as the present application, the entire content of which is incorporated herein by reference. In some implementations, fewer than all measured spectra are usable for determining the thicknesses. For example, the spectra that contain information about a combination of different structural features or devices may not be useful. Grouping the spectra can separate the useful spectra from those not usable. The useful group(s) of spectra can be further analyzed and thickness determinations made based on these groups can have a greater accuracy and precision than those made based on the ungrouped measured spectra.

In some implementations, a computer local or remote to the optical monitoring system, such as the controller 190 of FIG. 1, a computer, or others, can sort and group the measured spectra based on a clustering algorithm, e.g., a k-means clustering algorithm. The sorting and/or grouping can be performed automatically without any user input. The user may also be enabled, e.g., provided with a user interface, to interact with the sorting and/or grouping.

The computer automatically sorts and groups spectra from an in-situ, in-line, or in-sequence monitoring system; without being limited to any particular theory, the different groups of spectra correspond to different regions on the substrate having different structural features. The input to the algorithm can be data representing the measured spectra delivered from the monitoring system, locally or remotely relative to the computer. In particular, the input data represents measured light intensity over a range of wavelengths. The data can be raw measured data without being processed, or the data can be filtered or smoothed. In some implementations, the spectra measured for a wafer can be sorted and grouped after the wafer is polished. Any knowledge from the process of sorting and grouping, and associated subsequent signal processing, can be fed forward to control the next wafer polish, or to perform rework on the wafer just measured.

Figure 6:
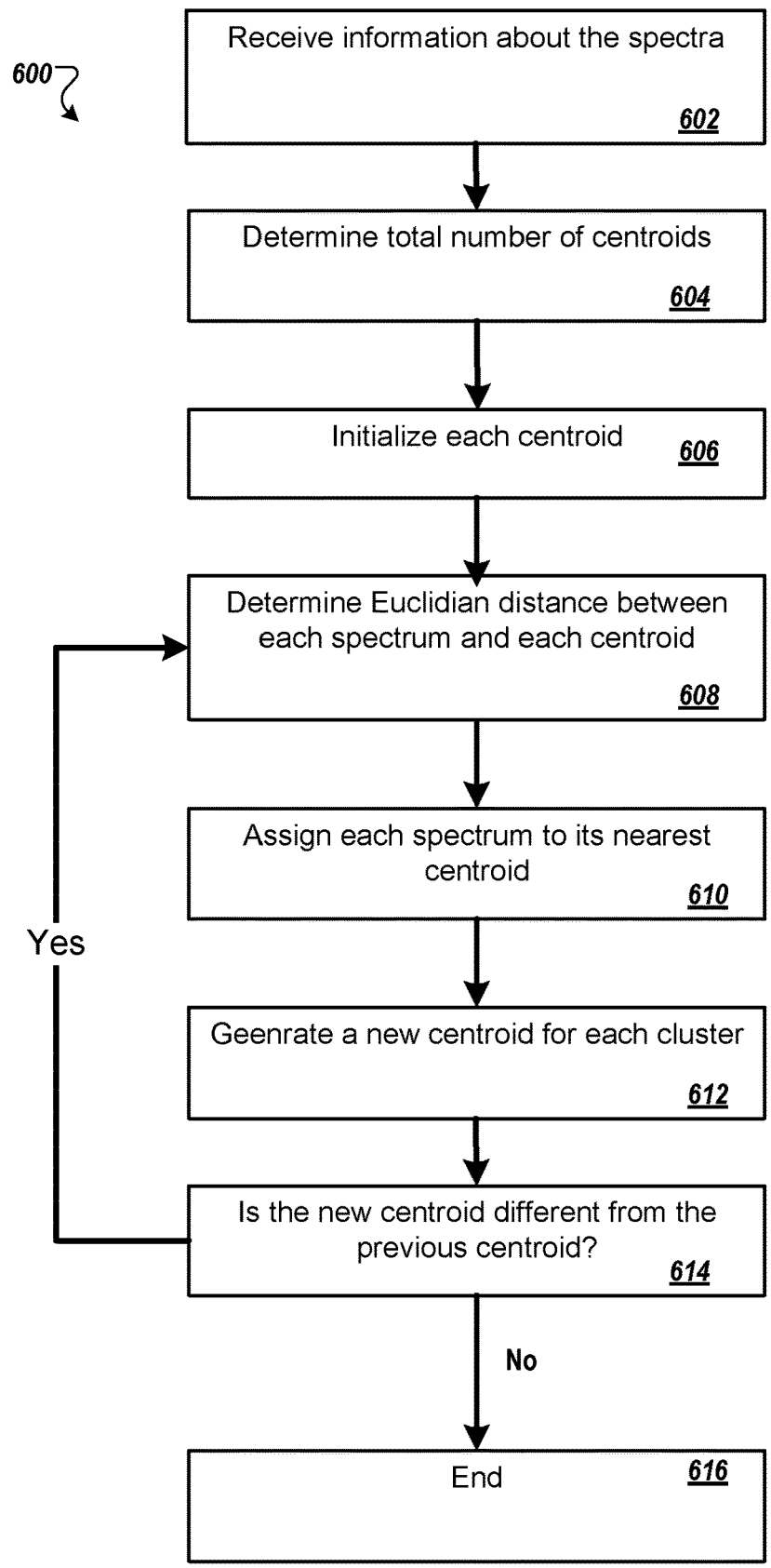
FIG. 6 is a flow diagram of an example process that clusters measured spectra.

In some implementations, the clustering algorithm is applied iteratively to the data to group spectra that represent different device types randomly measured by the monitoring system. A detailed process of sorting and grouping the measured spectra using a k-means clustering algorithm is in the example 600 shown in FIG. 6.

Initially, a computer to execute the algorithm receives (602) information about the spectra. Each spectra contains light intensity measured at a particular wavelength. A total of n light intensities can be measured at a total of n wavelengths such that the spectra can be represented by a vector having 1×n dimensions. In an example, n can be 200-500, e.g., 301. The information received by the computer includes the dimension of the spectra vectors. A user may send the information to the computer through a user interface. In some implementations, the information is a choice among options that are stored in the computer and presented to the user. The user interface may be interactive. For example, if the user does not input sufficient information, the user interface may prompt the user to continue with the input. The information may also be the spectra data, based on which the computer automatically extracts the information, such as the dimension of the spectra vectors. The received information can be stored, locally at the computer or at another, different computer.

Alternatively, the spectrum can be defined by the location, e.g., wavelength, and intensity of a set of peaks and/or valleys of the spectrum. In this case, the spectrum can be represented by a vector having 2m dimensions, where m is the number of peaks and/or valleys. Other definitions may also be used. The determined features can be stored, locally at the machine or at another, different machine. The computer also determines (604) the total number of centroids to be used in the k-means clustering. In some implementations, a user may determine the total number of centroids and input the number to the computer. The total number of centroids corresponds to the total number of groups to be formed by the clustering. After the clustering process, each centroid will represent the center of a cluster. As the clusters are formed of measured spectra, the centroid of each cluster is also a vector that has the same dimension as a measured spectrum.

The total number of centroids can be estimated by the number of groups of spectra expected, e.g., a priori based on the knowledge of the structural features of the wafer, or empirically based on spectra seen from test substrates and the like. The computer may receive information about the structural features or the expected number of spectra groups from user input. Alternatively or in addition, the computer may also automatically determine the number based on the received spectra data. Sometimes the total number of centroids is set to be higher than the number of clusters expected. For example, for fabrication of memory devices, the number of centroids may be set to be two based on the knowledge that there are only two types of regions (periphery and regular array). However, as discussed previously, there may be spectra that represent a combination of the two regions, e.g., a spot that overlaps both the periphery and the regular array. Accordingly, if the total number of centroids is set to be three, it may be easier to distinctly identify the pure array and pure peripheral spectra, and allow the third centroid to represent the spectra that are a mix of both.

Each centroid is then initialized (606), i.e., the initial value for each parameter of the centroid is set. The initialization can be performed automatically by the computer in a number of ways. An initialized centroid may correspond to one spectrum of the measured spectra. Alternatively, an initialized centroid may be a spectrum that does not correspond to any of the measured spectra.

In some implementations, the value for each parameter of each centroid can be randomly initialized to be values in an expected range. For example, the expected range of a parameter value at a wavelength can be determined based on the average of all spectra of the first rotation on which the clustering is performed. In another example, a user or a computer might pick an expected range and select the random number in that range (for each wavelength).

Figure 7:
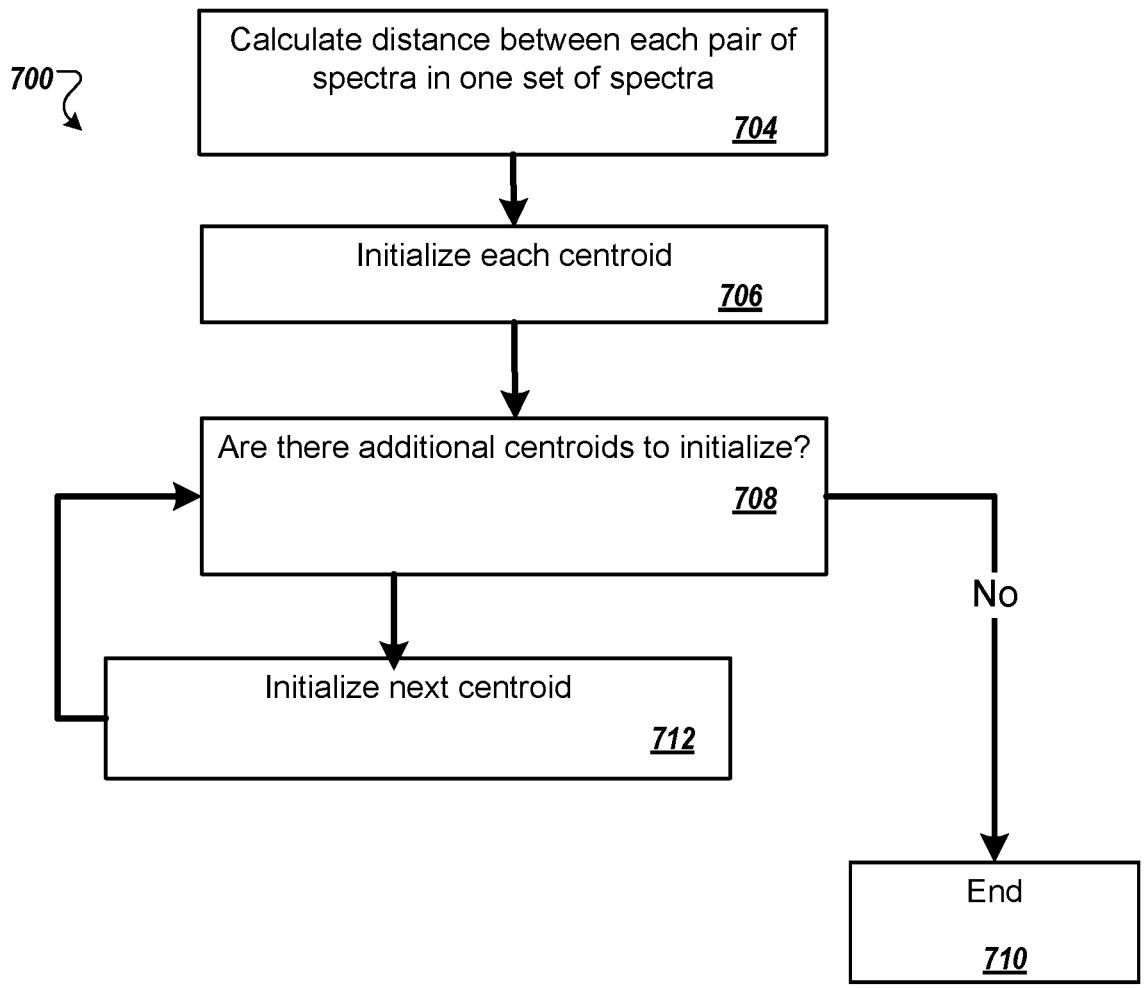
FIG. 7 is a flow diagram of an example process that initializes centroids of clusters of spectra.

Alternatively, the centroids can be initialized to use the measured spectra that are the farthest apart, e.g., using a Euclidean distance technique. FIG. 7 shows an example of such a process 700 for initializing centroids. Initially, for the entire set of measured spectra to be grouped or clustered, the Euclidean distance between each pair of measured spectra is calculated (704), e.g., as a sum of squared differences. Two centroids are initialized (706) to use the values of the two measured spectra of the pair of measured spectra that have the largest Euclidean distance.

Then a user or a computer determines (708) whether there are additional centroids to initialize. If not, then the centroid initialization process ends (710). If there are additional centroids, then the next centroid is initialized (712) to be a spectrum that has the largest Euclidean distance(s) to the previously initialized centroids. As an example, the largest Euclidean distance(s) can be found by summing the Euclidean distances between each measured spectrum and the previously initialized centroids, and choosing the spectrum that corresponds to the largest summed distance. Next, the process repeats from the step 708, until all centroids are initialized. In each iteration, a new centroid is initialized to a spectrum that has largest Euclidean distance to all previously initialized centroids. As a result, the initialized centroids are far apart from each other and span the spread of the spectral data across the parameter space.

Referring again to FIG. 6, after all centroids are initialized, the Euclidean distance between each measured spectrum and each centroid is calculated (608). Each spectrum is assigned (610) to its nearest centroid, where the closeness may be determined based on the calculated Euclidean distances (from step 608). Each centroid and all spectra assigned to the centroid forms a proposed group or a cluster. All spectra are assigned, and the previously set number of groups or clusters is formed.

Next, a new centroid is generated (612) for each proposed cluster. As an example, for each parameter, the values for that parameter from all the measured spectra in the proposed cluster are averaged. For example, for each wavelength, the light intensity of all spectra in the cluster at that wavelength is averaged. In this example, the new centroid thus represents a spectrum having the averaged light intensity at each wavelength for the measured spectra in the proposed cluster.

Then the computer determines (614) whether to iterate the process (608-612). In general, the process is iterated until the centroids are considered no longer moving or converging. In general, the computer can determine whether the centroids have stabilized by comparing the new centroid to the previous centroid. For example, the computer can determine if the values of the parameters of each new centroid exactly match the values from the previous centroid. However, the process can halt when, for each new centroid, the difference, e.g., the Euclidean distance, between each new centroid and the corresponding prior centroid, is smaller than a predetermined value. If yes, then the process 600 repeats from the step 608. If no, then the centroids are considered no longer moving or converged, and the process 600 ends (616). In some implementations, the process 600 ends (616) when a predetermined maximum number of iterations, e.g., 500 iterations, is reached. For example, in some situations, the difference between the new centroid and the previous centroid may not converge, i.e., go below the user-defined threshold, and the process 600 can end under an alternative standard.

When an in-situ monitoring system is used, spectra measurements can be performed at different rotations of polishing, e.g., at each polishing rotation. The spectra for one rotation are processed using the processes 600, 700 of FIGS. 6 and 7. In some implementations, after a set of spectra obtained during one rotation of the platen is clustered, the clusters are used for initializing another set of spectra for a subsequent rotation of the platen. For example, the centroids of the clusters can be used as the initial centroids for the other set of spectra. When spectra measurements are performed over more than two platen rotations, spectra of a subsequent rotation can be initialized by clustered spectra that are measured in a previous rotation, e.g., a rotation that is immediately before the subsequent rotation. Using such techniques, a given structural type, which corresponds to one cluster of spectra may be tracked throughout the polishing process. For in-sequence or inline monitoring, clusters of spectra formed for one wafer may be used to initialize spectra measured for subsequent wafers.

Referring again to FIG. 1, the controller 190 can further process the clustered spectra, e.g., to reduce or remove noise. The spectra from one of the clusters can then be used to calculate characterizing values for the substrate. A characterizing value is typically the thickness of a measured region in an outer layer of the substrate 10, but can be a related characteristic such as thickness removed. In addition, although not discussed in detail above, the characterizing value can be a physical property other than thickness, e.g., metal line resistance. The characterizing value can also be a more generic representation of the progress of the substrate through the polishing process, e.g., an index value representing the time or number of platen rotations at which the spectrum would be expected to be observed in a polishing process that follows a predetermined progress. Details of techniques for determining the characterizing value based on the spectrum are discussed in U.S. Pat. Nos. 7,764,377 and 8,992,286, the entire content of which is incorporated here by reference.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the in-sequence metrology station can be applicable to other types of substrate processing systems, e.g., etching or deposition systems.

Embodiments, such as spectra clustering, of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory storage medium for execution by, or to control the operation of, data processing apparatus. Alternatively or in addition, the program instructions can be encoded on an artificially generated propagated signal, e.g., a computer-generated electrical, optical, or electromagnetic signal, that is generated to encode information for transmission to suitable receiver apparatus for execution by a data processing apparatus. The computer storage medium can be a computer-readable storage device, a computer-readable storage substrate, a random or serial access memory device, or a combination of one or more of them.

The term "data processing apparatus" refers to data processing hardware and encompasses all kinds of apparatus, devices, and machines for processing data, including by way of example a programmable digital processor, a digital computer, or multiple digital processors or computers. The apparatus can also be or further include special purpose logic circuitry, e.g., an FPGA (field programmable gate array) or an ASIC (application specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, a module, a software module, a script, or code, can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a data communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit). For a system of one or more computers to be "configured to" perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

Control of the various systems and processes described in this specification, or portions of them, can be implemented in a computer program product that includes instructions that are stored on one or more non-transitory computer-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method of operating a polishing system, comprising:
   receiving, by one or more computers, a plurality of measured spectra reflected from a substrate at a plurality of different positions on the substrate, the substrate comprising at least two regions having different structural features;
   performing, by the one or more computers, a clustering algorithm on the plurality of measured spectra to separate the plurality of measured spectra into a number of groups based on the spectral characteristics of intensity values as a function of wavelength or frequency of the plurality of measured spectra, wherein performing the clustering algorithm includes initializing a plurality of centroids by selecting at least a pair of spectra from the plurality of measured spectra with the pair of spectra meeting a distance metric criterion, and setting the plurality of centroids to have the spectral characteristics of the selected spectra;
   selecting one of the number of groups to provide a selected group having a subset of spectra from the plurality of measured spectra;
   determining, in the one or more computers, at least one characterizing value for the substrate based on the subset of spectra of the selected group; and
   controlling polishing of the substrate based on the characterizing value, wherein controlling polishing of the substrate includes determining a polishing endpoint based on the characterizing value and stopping polishing at the polishing endpoint.

2. The method of claim 1, wherein the characterizing value is a thickness of an outermost layer of the substrate.

3. The method of claim 1, wherein the clustering algorithm comprises a k-means clustering algorithm.

4. The method of claim 1, wherein the plurality of measured spectra are measured with an in-line monitoring system before polishing of the substrate.

5. The method of claim 1, wherein the plurality of measured spectra are measured with an in-situ monitoring system during polishing of the substrate.

6. A computer program product residing on a computer readable medium, the computer program product comprising instructions for causing a processor to:
   receive a plurality of measured spectra reflected from a substrate at a plurality of different positions on the substrate, the substrate comprising at least two regions having different structural features;
   perform a clustering algorithm on the plurality of measured spectra to separate the plurality of measured spectra into a number of groups based on the spectral characteristics of intensity values as a function of wavelength or frequency of the plurality of measured spectra, wherein the instructions to perform the clustering algorithm include instructions to initialize a plurality of centroids by selecting at least a pair of spectra from the plurality of measured spectra with the pair of spectra meeting a distance metric criterion, and to set the plurality of centroids to have the spectral characteristics of the selected spectra;

select one of the number of groups to provide a selected group having a subset of spectra from the plurality of measured spectra;

determine at least one characterizing value for the substrate based on the subset of spectra of the selected group; and control polishing of the substrate based on the characterizing value, wherein the instructions to control polishing of the substrate comprise instructions to determine a polishing endpoint based on the characterizing value and cause a polishing system to stop polishing at the polishing endpoint based.

7. The computer program product of claim 6, wherein the instructions to select a pair of spectra from the plurality of measured spectra comprise instructions to select a pair of spectra having a greatest distance metric.

8. The computer program product of claim 7, wherein the instructions to select a pair of spectra having a greatest distance metric comprise instructions to determine a Euclidian distance between every pair of spectra from the plurality of measured spectra and select a pair of spectra that has the largest Euclidean distance.

9. The computer program product of claim 6, wherein the instructions to perform the clustering algorithm comprise instructions to assign each spectrum of the received plurality of measured spectra to its nearest, initialized centroid and form multiple groups based on the assignment.

10. The computer program product of claim 9, wherein the instructions to perform the clustering algorithm comprise instructions to generate a new centroid for each group by averaging the spectra in each group.

11. The computer program product of claim 10, wherein the instructions to perform the clustering algorithm comprise instructions to reassign each spectrum of the received plurality of measured spectra to its nearest new centroid and form multiple new groups based on the assignment.

12. The computer program product of claim 11, wherein the instructions to perform the clustering algorithm comprise instructions to iteratively update the new centroids and form new groups until the new centroids converge.

13. The computer program product of claim 6, wherein the characterizing value is a thickness of an outermost layer of the substrate.

14. A polishing system, comprising:

a support to hold a polishing pad;

a carrier head to hold a substrate comprising at least two regions having different structural features in contact with the polishing pad;

an in-situ optical monitoring system to measure a plurality of measured spectra reflected from a substrate at a plurality of different positions on the substrate; and a controller configured to receive the plurality of measured spectra from the in-situ optical monitoring system;

perform a clustering algorithm on the plurality of measured spectra to separate the plurality of measured spectra into a number of groups based on the spectral characteristics of intensity values as a function of wavelength or frequency of the plurality of measured spectra, wherein the controller is configured to perform the clustering algorithm by initializing a plurality of centroids by selecting at least a pair of spectra from the plurality of measured spectra with the pair of spectra meeting a distance metric criterion, and by setting the plurality of centroids to have the spectral characteristics of the selected spectra;

select one of the number of groups to provide a selected group having a subset of spectra from the plurality of measured spectra;

determine at least one characterizing value for the substrate based on the subset of spectra of the selected group; and control polishing of the substrate based on the characterizing value, wherein the controller is configured to determine a polishing endpoint based on the characterizing value and stop polishing at the polishing endpoint.

15. The polishing system of claim 14, wherein the characterizing value is a thickness of an outermost layer of the substrate.

* * * * *